United States Patent [19]
Birkeland

[11] Patent Number: 5,994,955
[45] Date of Patent: Nov. 30, 1999

[54] DRIVER AMPLIFIERS WITH LOW NOISE STANDBY MODE CHARACTERISTICS

[75] Inventor: Joel D. Birkeland, Hillsboro, Oreg.

[73] Assignee: Maxim Integrated Products, Inc., Sunnyvale, Calif.

[21] Appl. No.: 09/105,536

[22] Filed: Jun. 26, 1998

[51] Int. Cl.[6] .................................. H03F 1/14; H03F 3/68
[52] U.S. Cl. ........................................ 330/51; 330/124 D
[58] Field of Search .................................. 330/51, 124 R, 330/295, 124 D, 261

[56] References Cited

U.S. PATENT DOCUMENTS

| | | | |
|---|---|---|---|
| 4,586,078 | 4/1986 | Citta et al. | 358/86 |
| 4,924,191 | 5/1990 | Erb et al. | 330/295 |
| 5,325,000 | 6/1994 | Birkeland et al. | 307/529 |
| 5,451,907 | 9/1995 | Keane et al. | 330/295 |
| 5,488,413 | 1/1996 | Elder et al. | 348/13 |
| 5,506,544 | 4/1996 | Staudinger et al. | 330/277 |
| 5,631,846 | 5/1997 | Snurkowski | 364/514 B |
| 5,742,591 | 4/1998 | Himayat et al. | 370/286 |
| 5,896,062 | 4/1999 | Tiller et al. | 330/295 |

OTHER PUBLICATIONS

Maxim Integrated Products, Product Data Sheet 19–1331; Rev O; Feb. 1998, "Upstream CATV Driver Amplifier—MAX3532".

Primary Examiner—Robert Pascal
Assistant Examiner—Patricia T. Nguyen
Attorney, Agent, or Firm—Hickman, Stephens & Coleman, LLP

[57] ABSTRACT

The present invention teaches a variety of driver amplifiers having a transmit mode suitable for driving the load resistance of a network with an amplified version of the input signal, and a standby mode wherein the driver amplifier consumes substantially no current and isolates the load resistance from the input signal. These amplifiers are also characterized in that during transitions back and forth between standby mode and transmit mode, a minimum of standby transient leaks out onto the network. Further, the noise power delivered to the network in standby mode is substantially minimized, the remaining noise being primarily due to thermal noise produced by a resistor utilized to provide matched termination to the network.

30 Claims, 4 Drawing Sheets

5,994,955

DRIVER AMPLIFIERS WITH LOW NOISE STANDBY MODE CHARACTERISTICS

DESCRIPTION

1. Technical Field

The present invention is related to variable gain amplifiers. More specifically, the present invention teaches a variety of driver amplifiers having low noise standby mode characteristics and particularly suited for driving cable television networks.

2. Background Art

Prior Art FIG. 1 illustrates a cable television (CATV) network 10 having a plurality of modem amplifiers 100 intended for upstream cable operation. Load resistor $R_{LOAD}$ represents the impedance associated with the CATV network 10. The amplifiers 100 have several modes of operation including a standby mode and a transmit mode. When in transmit mode, the amplifier 100 is capable of driving the load resistor $R_{LOAD}$ by transmitting a signal onto the network 10. The transmit mode typically includes several different high power and low power transmit states but, for present purposes, categorizing according to the two modes standby and transmit is sufficient. When in standby mode, any input driving the amplifier 100 is substantially isolated from the network 10.

In designing amplifiers for applications such as these, at least five design parameters must be addressed. First, during standby mode input to an amplifier 100 must be substantially isolated from the network 10 and not transmit a signal onto the network 10. Second, the impedance of the amplifier 100 should match the impedance of the network 10. Third, current (i.e., power) consumption of the amplifier 100 should be as minimal as possible during standby mode. Fourth, in addition to not leaking a signal onto the network 10, the amplifier 100 should not generate any standby noise. Fifth, "standby transient," i.e., noise generated by the amplifier 100 during transition from standby mode to active mode and vice versa, must be kept to a minimum.

Prior Art FIG. 2 illustrates one modem amplifier 100 designed to address several of these design parameters. The amplifier 100, designed particularly for upstream cable applications, includes a programmable gain amplifier (PGA) 102, a pair of op-amps 104 and 106, a pair of resistors $R_1$ and $R_2$, and a transformer 108. PGA 102 drives the op-amps 104 and 106 which in turn drive the primary winding of the transformer 108 through resistors $R_1$ and $R_2$. One terminal of the secondary winding of transformer 108 is coupled to the network 10 while the other terminal is coupled to a common ground reference 50.

Transmit mode for the amplifier 100 is effectuated by operating the op-amps 104 and 106 in differential mode. Standby mode is effectuated by operating the op-amps 104 and 106 in common mode. The transformer 108 substantially isolates the amplifier 100 from the network 10 during standby mode since the magnetic fields generated within the transformer 108 will (ideally) cancel one another out when the op-amps 104 and 106 operate in common mode. Resistors $R_1$ and $R_2$ are chosen such that during standby mode the impedance of the amplifier 100 matches the network. Further, there is little standby transient because both the transmit mode and the standby mode are active states and thus transitioning between the two modes generates minimal transient noise.

While perhaps the best option taught by the prior art, the amplifier 100 has several shortcomings. For one, the amplifier 100 consumes substantial current during standby mode, approximately the same as during transmit mode. This is because during standby mode the op-amps 104 and 106 are in an active common mode. For the same reason, the noise power of the amplifier 100 is relatively high during standby mode.

What is needed is an amplifier suitable for upstream cable operation that minimizes current consumption and noise generation during a standby mode, yet does not produce significant standby transients.

DISCLOSURE OF THE INVENTION

The present invention teaches a variety of driver amplifiers having a transmit mode suitable for driving the load resistance of a network with an amplified version of the input signal, and a standby mode wherein the driver amplifier consumes substantially no current and isolates the load resistance from the input signal. These amplifiers are also characterized in that during the transition between standby mode and transmit mode, a minimum of standby transient leaks out onto the network. Further, the noise power delivered to the network in standby mode is substantially minimized, the remaining noise being primarily due to thermal noise produced by a resistor utilized to provide matched termination to the network.

A first embodiment of the present invention teaches a driver amplifier having a pair of amplifiers and a bias generator circuit for controlling the amplifiers. Each of the amplifiers has an input, an output, and a bias control input, the output signal generated by each amplifier being a function of signals applied at the input and the bias control input. The bias generator circuit is coupled to the bias control inputs and is operable to place the first and second amplifiers into a standby mode wherein the first and second amplifiers are turned off, the bias generator operable to place the first and second amplifiers into an active mode wherein the first and second amplifiers are turned on.

The bias generator circuit and the pair of amplifiers operate together such that when the bias generator transitions the first and second amplifiers between standby and transmit modes, the bias transient generated by the first and second amplifiers occurs in a common mode so that a magnitude of transient noise generated by the first amplifier is substantially similar to a magnitude of transient noise generated by the second amplifier.

The driver amplifiers of the present invention may further include a combining network coupled to the first and second amplifier outputs. Such a combining network is operable to respond to differential signals generated at the first and second amplifier outputs and produce therefrom an output signal. Additionally, the combining network has common-mode rejection characteristics such that any common-mode signal generated by the first and second amplifiers does not leak into the combining network output signal.

BRIEF DESCRIPTION OF THE DRAWINGS

Prior Art

Prior Art

BEST MODES FOR CARRYING OUT THE INVENTION

Figure 3:
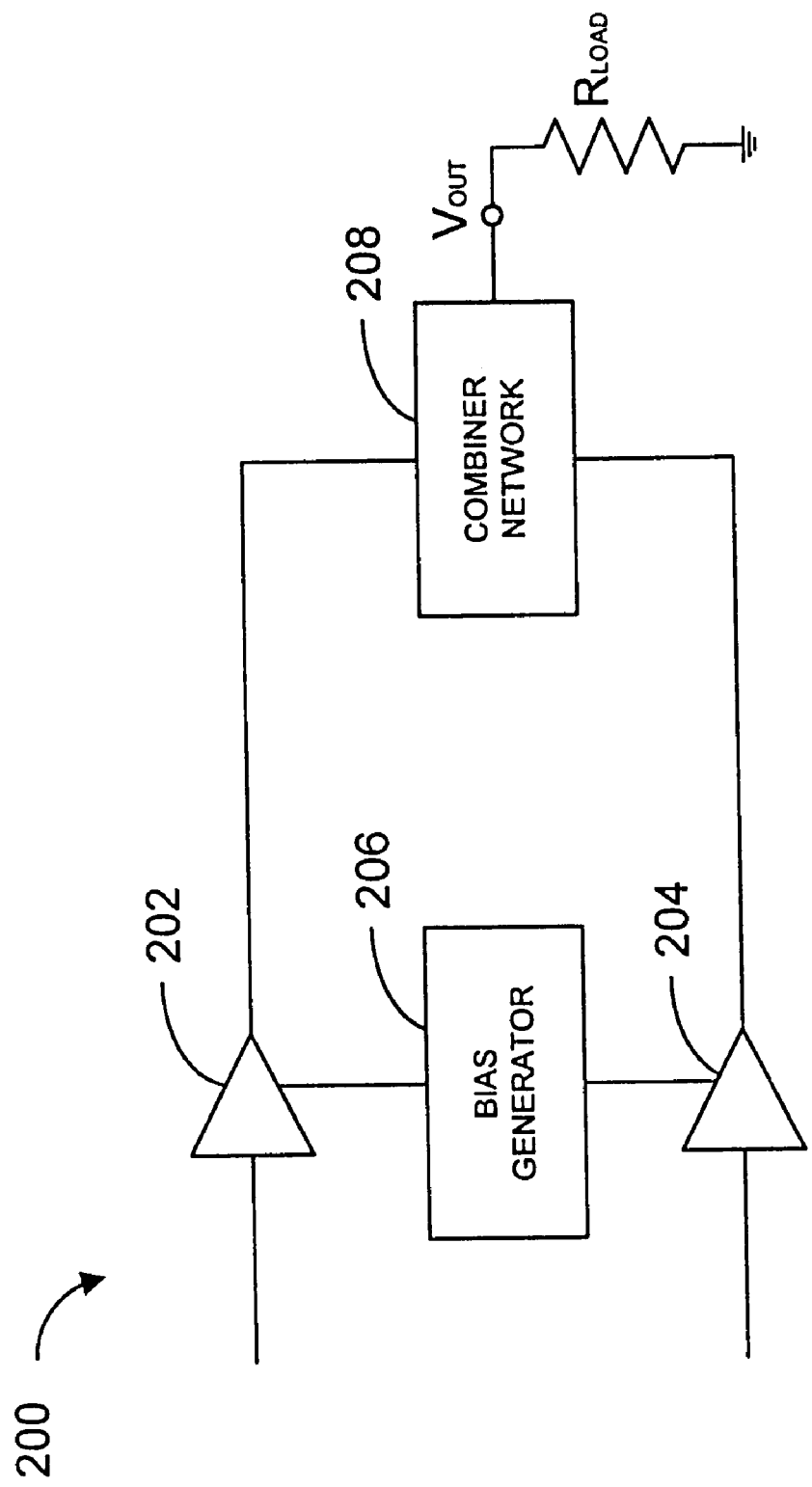
FIG. 3 is a block diagram schematic showing an upstream driver amplifier in accordance with one embodiment of the present invention.

FIG. 3 illustrates a driver amplifier 200 in accordance with one embodiment of the present invention. The driver amplifier 200 includes a pair of amplifiers 202 and 204, a bias generator 206, and a combiner network 208. The amplifiers 202 and 204 are suitable for operation in either common or differential modes. The combiner network 208 is a common-mode rejection device suitable for generating an output transmission signal to the network 10 from differential signals generated by the amplifiers 202 and 204. For example, a center-tapped transformer such as that described below with reference to FIG. 5 would be a suitable embodiment for the combiner network 208.

Figure 2:
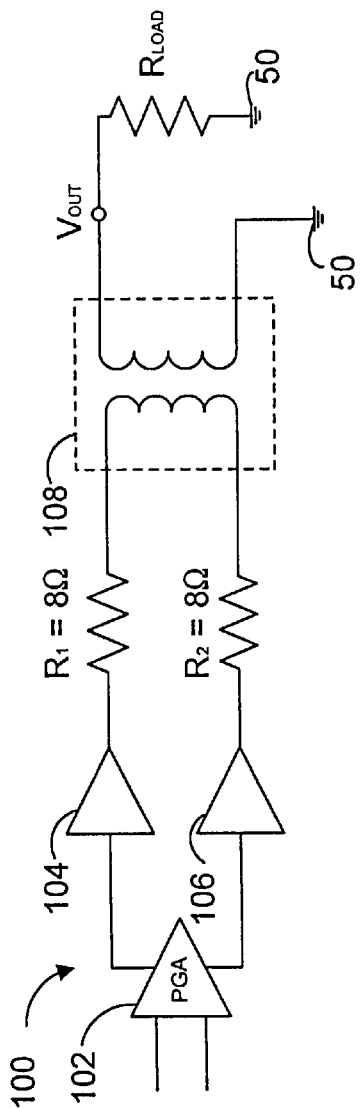
FIG. 2 is a schematic of one traditional upstream CATV driver amplifier.
Figure 1:
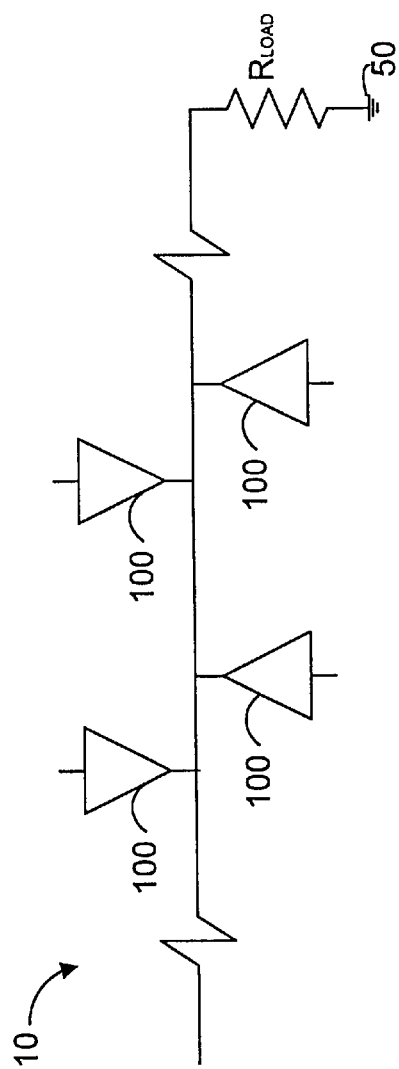
FIG. 1 illustrates a CATV network having a multiplicity of driver amplifiers.

The bias generator 206 is coupled to and controls operation of the amplifiers 202 and 204 as follows. During a transmit mode 250, the bias generator 206 operates the amplifiers 202 and 204 in differential mode. This enables the amplifiers 202 and 204 to drive the combiner network 208 thus generating an output signal across a network such as network 10 of FIG. 1.

During a standby mode 252, the bias generator 206 forces both amplifiers 202 and 204 into a power-off state wherein the amplifiers 202 and 204 consume substantially no current and generate substantially no output signal. During transition from the standby mode 250 to a transmit mode 252, any transient signal due to the change in bias state of the amplifiers 202 and 204 will occur in a common mode. Since the combiner network 208 has common-mode rejection characteristics, the standby transient does not leak out onto the network 10. In summary, the driver amplifier 200 of the present invention has substantially zero current consumption during standby mode and substantially zero standby transient noise.

Figure 4:
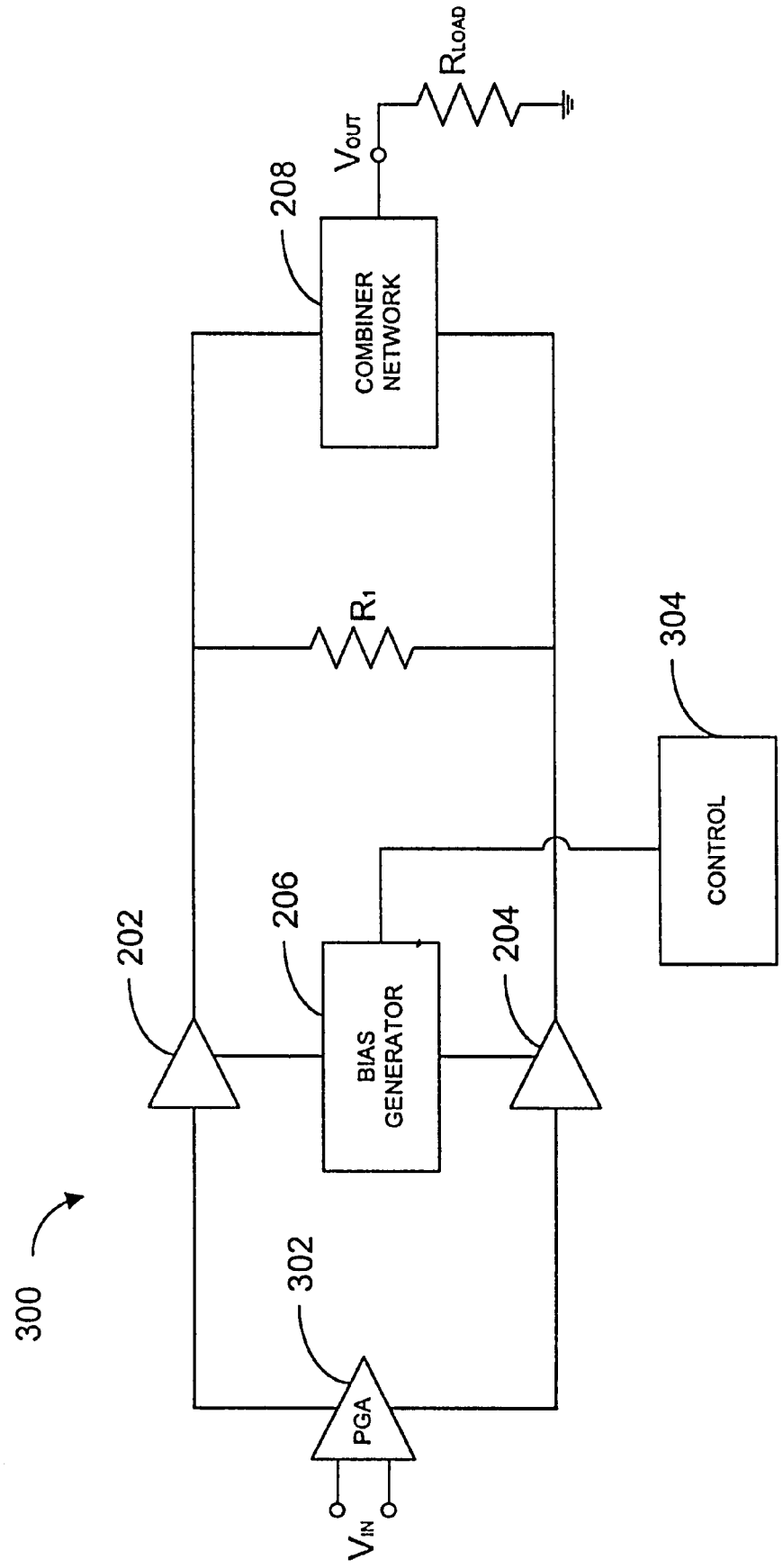
FIG. 4 is a block diagram schematic showing a variable gain upstream driver amplifier particularly suited for a CATV application in accordance with another embodiment of the present invention.

With reference to FIG. 4, a driver amplifier 300 in accordance with another embodiment of the present invention will now be described. The driver amplifier 300 has characteristics similar to the amplifier 200 of FIG. 3, but is particularly suited for use as a programmable power amplifier in upstream cable operations. The amplifier 300 includes a PGA 302, a pair of amplifiers 202 and 204, a bias generator 206, a control device 304, a combiner network 208, and a resistor $R_1$. The amplifiers 202 and 204, the bias generator 206, and the combiner network 208 operate as described above with reference to FIG. 3.

The control device 304 is suitable to add additional functionality to the bias generator 206. In particular, it is contemplated that current to the amplifiers 202 and 204 can be provided in a ramped manner during the transition from standby mode 252 to transmit mode 252, thereby even further decreasing any standby transient noise leaking through the combiner network 208 out onto the network 10. The value of resistor $R_1$ provided in parallel across the combiner network 208 is chosen such that the impedance of the driver amplifier 300 appears matched with the network 10 during the standby mode 252.

Figure 5:
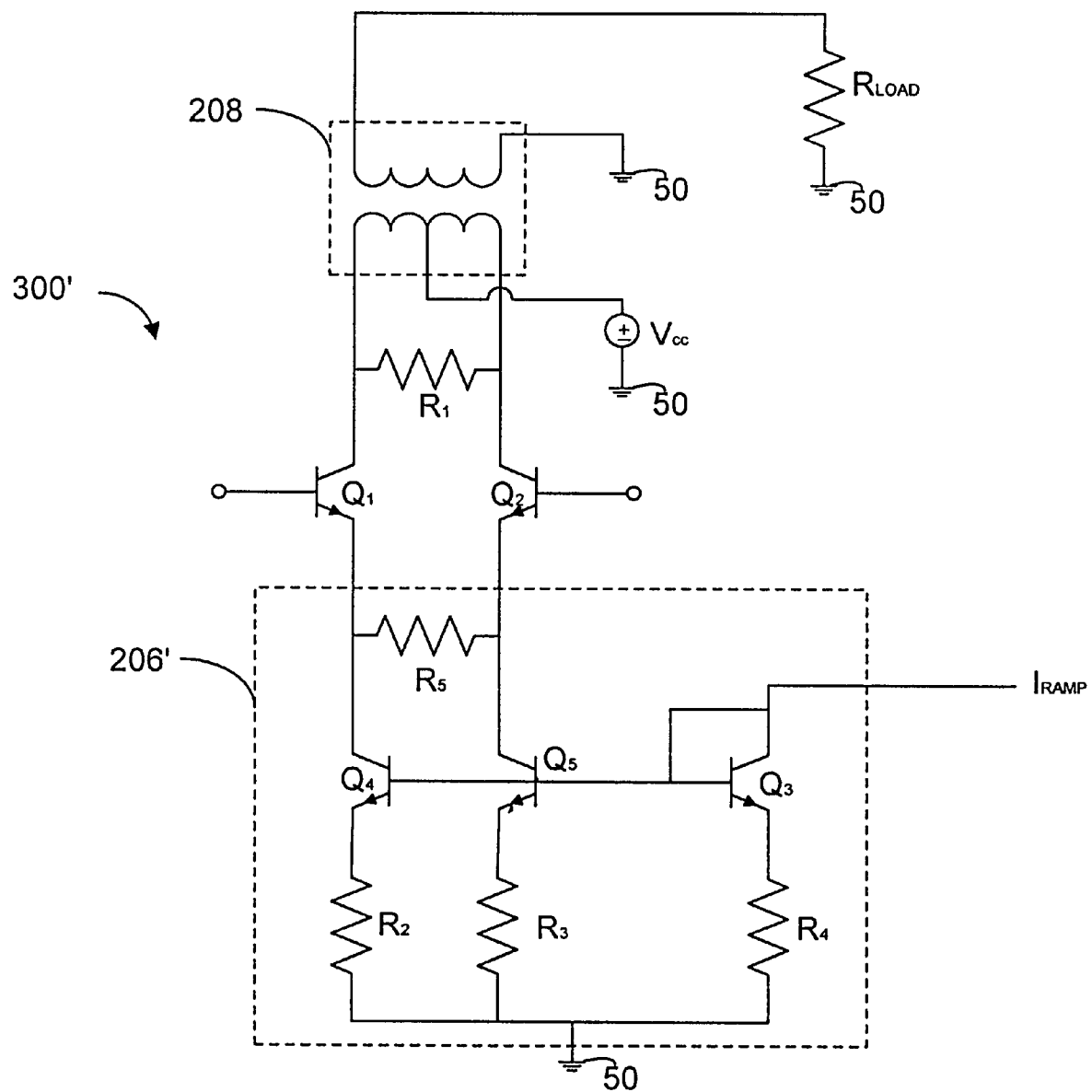
FIG. 5 is a more detailed schematic of one particular embodiment of the variable gain upstream driver amplifier of FIG. 3.

With reference to FIG. 5, a driver amplifier 300' in accordance with yet another embodiment of the present invention will now be described. The driver amplifier 300' is a particular embodiment of the driver amplifier 300 of FIG.

4. In the driver amplifier 300', the amplifiers 202 and 204 are implemented by a pair of npn transistors Q1 and Q2. Thus when the transistors Q1 and Q2 are turned off, a high impedance will appear at their output and the impedance presented to the input of the center-tapped transformer combining network 208' essentially consists of the resistor $R_1$. Thus the noise power that leaks out onto the network 10 is only that thermal noise generated in the resistor $R_1$, which results in a very low noise condition during standby mode. The resistor $R_1$ is preferably selected to insure a matched condition with the network.

The bias generator 206' includes a current mirror formed by transistors Q3–Q5, and resistors $R_2$–$R_5$ selected to provide the proper current dumping through the bias generator 206' to a common ground reference 50. The control device 304 provides bias current Iramp to the transistor Q3. Under ideal conditions, the components of the amplifier 300' would be perfectly matched. However, by providing bias current Iramp as a ramped current, much of the standby transient noise due to mismatch can be eliminated.

Although only a few embodiments of the present invention have been described in detail herein, it should be understood that the present invention may be embodied in many other specific forms without departing from the spirit or scope of the invention.

For example, the symbol utilized to denote transistors in the Figures is generally known to represent bipolar type transistor technology. However, it will be appreciated that field-effect transistors (FETs) such as MOSFETs would work well for the present invention.

Therefore, the present examples and embodiments are to be considered as illustrative and not restrictive, and the invention is not to be limited to the details given herein, but may be modified within the scope of the appended claims.

I claim:

1. A driver amplifier operable to enter a standby mode, the driver amplifier comprising:

a first amplifier having an input, an output, and a bias control input, the first amplifier operable to generate a first differential signal at the first amplifier output, the first differential signal being a function of signals applied at the first amplifier input and the first amplifier bias control input;

a second amplifier having an input, an output, and a bias control input, the second amplifier operable to generate a second differential signal at the second amplifier output, the second differential signal being a function of signals applied at the second amplifier input and the second amplifier bias control input;

a bias generator circuit coupled to the first amplifier bias control input and the second amplifier bias control input, the bias generator operable to place the first and second amplifiers into a standby mode wherein the first and second amplifiers are turned off, the bias generator operable to place the first and second amplifiers into an active mode wherein the first and second amplifiers are turned on, wherein the bias generator circuit, the first amplifier, and the second amplifier operate together such that when the bias generator transitions the first and second amplifiers between standby and transmit modes the first and second amplifiers transition simultaneously such that a magnitude of transient noise generated by the first amplifier is substantially similar to a magnitude of transient noise generated by the second amplifier, the driver amplifier further operable such that the first and second amplifiers draw substantially no current when the first and second amplifiers are in the standby mode.

2. A driver amplifier as recited in claim 1, wherein the first and second amplifiers produce substantially no current at the first and second amplifier outputs when the first and second amplifiers are in the standby mode.

3. A driver amplifier as recited in claim 1 wherein the first and second amplifiers are first and second transistors each having a base, a collector, and an emitter.

4. A driver amplifier as recited in claim 3 wherein the first transistor base is the first amplifier input, the first transistor collector is the first amplifier output, and the first transistor emitter is the first amplifier bias control input.

5. A driver amplifier as recited in claim 4 wherein the second transistor base is the second amplifier input, the second transistor collector is the second amplifier output, and the second transistor emitter is the second amplifier bias control input.

6. A driver amplifier as recited in claim 1 wherein the bias generator circuit includes three transistors coupled together as a current mirror arranged to steer current through the first and second amplifiers as a function of a bias current Iramp provided at the collector of the third transistor.

7. A driver amplifier as recited in claim 6 wherein the bias current Iramp is substantially zero amps during the standby mode, and during transition from the standby mode to a transmit mode, the bias current Iramp ramps from zero amps to a steady state transmit current.

8. A driver amplifier as recited in claim 1 further including a resistor $R_1$ coupled across the first and second amplifier outputs, the resistor $R_1$ suitable for matching impedance of the driver amplifier during the standby mode with a load the driver amplifier is intended to drive.

9. A driver amplifier as recited in claim 1 further including a combining network coupled to the first and second amplifier outputs, the combining network operable to respond to differential signals generated at the first and second amplifier outputs and produce therefrom an output signal, the combining network having common-mode rejection characteristics such that transient noise generated by the first and second amplifiers during transition between standby and transmit modes does not leak into the combining network output signal.

10. A driver amplifier as recited in claim 9 further including a resistor $R_1$ coupled across the first and second amplifier outputs, the resistor $R_1$ suitable for matching impedance of the driver amplifier during the standby mode with a load the driver amplifier in intended to drive.

11. A driver amplifier as recited in claim 1 further including a programmable gain amplifier operable to deliver a balanced signal to the first and second amplifiers.

12. A driver amplifier as recited in claim 11 wherein the components of the driver amplifier are formed together on a single integrated circuit package.

13. A driver amplifier as recited in claim 1 wherein the components of the driver amplifier are formed together on a single integrated circuit package.

14. A driver amplifier having a standby mode and a transmit mode, the driver amplifier comprising:
- a first amplifier having an input, an output, and a bias control input, the first amplifier operable to generate a first differential signal at the first amplifier output, the first differential signal being a function of signals applied at the first amplifier input and the first amplifier bias control input;
- a second amplifier having an input, an output, and a bias control input, the second amplifier operable to generate a second differential signal at the second amplifier output, the second differential signal being a function of signals applied at the second amplifier input and the second amplifier bias control input;
- a bias generator circuit coupled to the first amplifier bias control input and the second amplifier bias control input, the bias generator operable to place the first and second amplifiers into a standby mode wherein the first and second amplifiers are turned off, the bias generator operable to place the first and second amplifiers into an active mode wherein the first and second amplifiers are turned on; and
- a combining network coupled to the first and second amplifier outputs, the combining network operable to respond to differential signals generated at the first and second amplifier outputs and produce therefrom an output signal, the combining network having common-mode rejection characteristics such that any common-mode signal generated by the first and second amplifiers does not leak into the combining network output signal,
- wherein the bias generator circuit, the first amplifier, and the second amplifier operate together such that when the bias generator transitions the first and second amplifiers between standby and transmit modes the first and second amplifiers operate in a common mode such that a magnitude of transient noise generated by the first amplifier is substantially similar to a magnitude of transient noise generated by the second amplifier.

15. A driver amplifier as recited in claim 14, wherein the first and second amplifiers draw substantially no current when the first and second amplifiers are in the standby mode.

16. A driver amplifier as recited in claim 14, wherein the first and second amplifiers produce substantially no current at the first and second amplifier outputs when the first and second amplifiers are in the standby mode.

17. A driver amplifier as recited in claim 14 wherein the first and second amplifiers are first and second transistors each having a base, a collector, and an emitter.

18. A driver amplifier as recited in claim 17 wherein the first transistor base is the first amplifier input, the first transistor collector is the first amplifier output, and the first transistor emitter is the first amplifier bias control input.

19. A driver amplifier as recited in claim 18 wherein the second transistor base is the second amplifier input, the second transistor collector is the second amplifier output, and the second transistor emitter is the second amplifier bias control input.

20. A driver amplifier as recited in claim 14 wherein the bias generator circuit includes three transistors coupled together as a current mirror arranged to steer current through the first and second amplifiers as a function of a bias current Iramp provided at the collector of the third transistor.

21. A driver amplifier as recited in claim 20 wherein the bias current Iramp is substantially zero amps during the standby mode, and during transition from the standby mode to a transmit mode, the bias current Iramp ramps from zero amps to a steady state transmit current.

22. A driver amplifier as recited in claim 14 further including a resistor $R_1$ coupled across the first and second amplifier outputs, the resistor $R_1$ suitable for matching impedance of the driver amplifier during the standby mode with a load the driver amplifier in intended to drive.

23. A driver amplifier as recited in claim 14 wherein the combiner network is a transformer.

24. A network comprising a driver amplifier as recited in claim 14.

25. A network as recited in claim 24, the network being a cable television network.

26. A network comprising a plurality of driver amplifiers, wherein at least one of the driver amplifiers has a standby mode and a transmit mode, the standby mode placing the at least one driver amplifier in a power off state such that the at least one driver amplifier consumes substantially no current and generates substantially low noise across the network during the standby mode, the at least one driver amplifier being substantially matched with the network during the standby mode, the at least one driver amplifier generating substantially no transient noise when transitioning between the standby and transmit modes.

27. A network as recited in claim 26 wherein the network is a cable television network.

28. A driver amplifier operable to enter a standby mode, the driver amplifier comprising:

- a first amplifier having an input, an output, and a bias control input, the first amplifier operable to generate a first differential signal at the first amplifier output, the first differential signal being a function of signals applied at the first amplifier input and the first amplifier bias control input;
- a second amplifier having an input, an output, and a bias control input, the second amplifier operable to generate a second differential signal at the second amplifier output, the second differential signal being a function of signals applied at the second amplifier input and the second amplifier bias control input;
- a bias generator circuit coupled to the first amplifier bias control input and the second amplifier bias control input, the bias generator operable to place the first and second amplifiers into a standby mode wherein the first and second amplifiers are turned off, the bias generator operable to place the first and second amplifiers into an active mode wherein the first and second amplifiers are turned on,
- wherein the bias generator circuit, the first amplifier, and the second amplifier operate together such that when the bias generator transitions the first and second amplifiers between standby and transmit modes the first and second amplifiers transition simultaneously such that a magnitude of transient noise generated by the first amplifier is substantially similar to a magnitude of transient noise generated by the second amplifier, the first amplifier operating such that substantially no current is generated thereby at the first amplifier output when the first amplifier is in the standby mode, the second amplifier operating such that substantially no current is generated thereby at the second amplifier output when the second amplifier is in the standby mode.

29. A driver amplifier operable to enter a standby mode, the driver amplifier comprising:

- a first amplifier having an input, an output, and a bias control input, the first amplifier operable to generate a first differential signal at the first amplifier output, the first differential signal being a function of signals applied at the first amplifier input and the first amplifier bias control input, the first amplifier being a first transistor having a first transistor base, a first transistor collector, and a first transistor emitter;
- a second amplifier having an input, an output, and a bias control input, the second amplifier operable to generate a second differential signal at the second amplifier output, the second differential signal being a function of signals applied at the second amplifier input and the second amplifier bias control input, the second amplifier being a second transistor having a second transistor base, a second transistor collector, and a second transistor emitter;
- a bias generator circuit coupled to the first amplifier bias control input and the second amplifier bias control input, the bias generator operable to place the first and second amplifiers into a standby mode wherein the first and second amplifiers are turned off, the bias generator operable to place the first and second amplifiers into an active mode wherein the first and second amplifiers are turned on,
- wherein the bias generator circuit, the first amplifier, and the second amplifier operate together such that when the bias generator transitions the first and second amplifiers between standby and transmit modes the first and second amplifiers transition simultaneously such that a magnitude of transient noise generated by the first amplifier is substantially similar to a magnitude of transient noise generated by the second amplifier.

30. A driver amplifier operable to enter a standby mode, the driver amplifier comprising:

- a first amplifier having an input, an output, and a bias control input, the first amplifier operable to generate a first differential signal at the first amplifier output, the first differential signal being a function of signals applied at the first amplifier input and the first amplifier bias control input;
- a second amplifier having an input, an output, and a bias control input, the second amplifier operable to generate a second differential signal at the second amplifier output, the second differential signal being a function of signals applied at the second amplifier input and the second amplifier bias control input;
- a bias generator circuit coupled to the first amplifier bias control input and the second amplifier bias control input, the bias generator operable to place the first and second amplifiers into a standby mode wherein the first and second amplifiers are turned off, the bias generator operable to place the first and second amplifiers into an active mode wherein the first and second amplifiers are turned on; and
- a combining network coupled to the first and second amplifier outputs, the combining network operable to respond to differential signals generated at the first and second amplifier outputs and produce therefrom an output signal, the combining network having common-mode rejection characteristics such that transient noise generated by the first and second amplifiers during transition between standby and transmit modes does not leak into the combining network output signal,
- wherein the bias generator circuit, the first amplifier, and the second amplifier operate together such that when the bias generator transitions the first and second amplifiers between standby and transmit modes the first and second amplifiers transition simultaneously such that a magnitude of transient noise generated by the first amplifier is substantially similar to a magnitude of transient noise generated by the second amplifier, the driver amplifier further operable such that the first and second amplifiers produce substantially no current at the first and second amplifier outputs when the first and second amplifiers are in the standby mode.

* * * * *